United States Patent
Saito et al.

(10) Patent No.: US 7,598,140 B2
(45) Date of Patent: Oct. 6, 2009

(54) METHOD OF PRODUCING A SEMICONDUCTOR DEVICE HAVING AN OXIDE FILM

(75) Inventors: Yuki Saito, Tokyo (JP); Yasutaka Kobayashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 222 days.

(21) Appl. No.: 11/237,688

(22) Filed: Sep. 29, 2005

(65) Prior Publication Data
US 2006/0079078 A1   Apr. 13, 2006

Related U.S. Application Data

(62) Division of application No. 10/336,737, filed on Jan. 6, 2003, now Pat. No. 6,979,858.

(51) Int. Cl.
*H01L 21/336* (2006.01)
(52) U.S. Cl. .............. 438/265; 438/257; 438/261; 438/264; 438/593; 438/594; 438/595; 438/663; 438/770
(58) Field of Classification Search .......... 438/257, 438/261, 264, 265, 593–595, 663, 770
See application file for complete search history.

(56) References Cited

U.S. PATENT DOCUMENTS

| | | | |
|---|---|---|---|
| 5,208,175 A * | 5/1993 | Choi et al. ........... | 438/261 |
| 5,498,556 A | 3/1996 | Hong et al. | |
| 5,880,498 A * | 3/1999 | Kinoshita et al. ...... | 257/315 |
| 5,966,606 A | 10/1999 | Ono | |
| 6,288,419 B1 | 9/2001 | Prall et al. | |
| 6,355,522 B1 | 3/2002 | Chang et al. | |
| 6,624,023 B1 | 9/2003 | Han et al. | |
| 2003/0127682 A1* | 7/2003 | Lee et al. ............. | 257/315 |

FOREIGN PATENT DOCUMENTS

| | | |
|---|---|---|
| JP | 09-307106 | 11/1997 |
| JP | 11-163317 | 6/1999 |

* cited by examiner

*Primary Examiner*—Zandra Smith
*Assistant Examiner*—Bac H Au
(74) *Attorney, Agent, or Firm*—Volentine & Whitt, P.L.L.C.

(57) ABSTRACT

A semiconductor device having excellent characteristics is provided without deteriorated film quality. A first oxide film is divided into three regions A, B and C. Lengths I, II and III of the regions A, B and C in a plane direction of the silicon substrate are set equal to each other. In the first oxide film, a thermal treatment is carried out such that the film thicknesses of the regions A and C are increased. The thermal treating time, the thermal treating temperature and other parameters are adjusted such that sectional areas of the regions A and C become 1.5 times of a sectional area of the region B, while a film thickness of the region B is maintained.

11 Claims, 5 Drawing Sheets

A

B

C

D

A

B

A

B

METHOD OF PRODUCING A SEMICONDUCTOR DEVICE HAVING AN OXIDE FILM

CROSS REFERENCE TO RELATED APPLICATIONS

This is a divisional application of application Ser. No. 10/336,737, filed Jan. 6, 2003, now U.S. Pat. No. 6,979,858, which is hereby incorporated by reference in its entirety for all purposes.

BACKGROUND OF THE INVENTION

1. Field of the Invention

The present invention relates to a semiconductor device and a producing method of the same.

2. Description of the Prior Art

A conventional producing method of a flash memory is as follows. First, an active region is formed on a silicon substrate. A first oxide film (film thickness is about 100 Å) is formed on the active region. A first polysilicon film (film thickness is about 1000 Å) is formed on the first oxide film by CVD (Chemical Vapor Deposition) method. A second oxide film is formed on the first polysilicon film, and a second polysilicon film is formed on the second oxide film.

Finally, the first polysilicon film becomes a floating gate of a flash memory cell, and the second polysilicon film becomes a control gate. The first oxide film electrically insulates between the active region and the floating gate (first polysilicon film), and the second oxide film electrically insulates between the floating gate (first polysilicon film) and the control gate (second polysilicon film).

On the second polysilicon film, a tungsten silicide film is formed which functions as an electrode.

Next, photolithography process and etching process are carried out to form a flash memory cell having desired characteristics. Then, a third oxide film for covering the flash memory cell is formed. Then, a flash memory is completed through some processes.

According to the conventional producing method, however, in the etching process for forming a gate electrode of the flash memory cell, and in an ion implantation process for forming the active region, there is an adverse possibility that a gate oxide film (first oxide film/second oxide film) constituting the flash memory cell is damaged.

If the gate oxide film is damaged and a film quality is deteriorated, the insulation performance between the floating gate (first polysilicon film) and the active region is deteriorated, and the insulation performance between the floating gate and the memory cell electrode is also deteriorated. As a result, there is a possibility that data retention time and the number of data rewriting which are required for the flash memory cell can not be secured.

SUMMARY OF THE INVENTION

The present invention has been accomplished in view of the above problem, and it is an object of the invention to provide a semiconductor device having excellent characteristics, and to provide a producing method of the semiconductor device capable of producing the semiconductor device having excellent characteristics without deteriorating a film quality in the producing process.

To achieve the above object, according to a first aspect of the present invention, there is provided a semiconductor device having a trapezoidal portion comprising a first oxide film and a plurality of other films. If the first oxide film is divided into a first peripheral region to which the end face of the first oxide film belongs and a first central region surrounded by the first peripheral region, in the semiconductor device of the invention, a film thickness of the first oxide film in the first peripheral region is thicker than that of the first oxide film in the first central region.

When a second oxide film is included in the plurality of films constituting the trapezoidal portion, the second oxide film is also divided into a second peripheral region to which the end face of the second oxide film belongs and a second central region surrounded by the second peripheral region. It is preferable that a film thickness of the second oxide film in the second peripheral region is thicker than that of the second oxide film in the second central region.

If an ion implanting process is carried out, there is a high probability that implanted ion collides against the end of the first oxide film and the end of the second oxide film. In this regard, according to the invention, since film thicknesses of ends of oxide films are increased, it is possible to moderate damage caused by collision of ion.

According to a second aspect of the invention, there is provided a producing method of a semiconductor device having a trapezoidal portion comprising a first oxide film and a plurality of other films. In the producing method, a first peripheral region to which an end face of the first oxide film belongs, and a first central region surrounded by the first peripheral region are defined concerning the first oxide film. After the trapezoidal portion is formed by etching for example, thermal treatment is carried out. In this thermal treatment, a thermal treating temperature, a thermal treating time, atmosphere and other parameters are adjusted such that the film thickness of the first oxide film in the first peripheral region becomes thicker than that of the first oxide film in the first central region.

When the second oxide film is included in the plurality films constituting the trapezoidal portion, there is added a step for defining a second peripheral region to which the end face of the second oxide film belongs and a second central region surrounded by the second peripheral region are defined for the second oxide film. The thermal treatment is carried out after the trapezoidal portion is formed by etching for example. In the thermal treatment, parameters of the thermal treatment are adjusted such that the film thickness of the second oxide film in the second peripheral region becomes thicker than that of the second oxide film in the second central region. It is preferable that the thermal treatment for increasing the film thickness of the second peripheral region of the second oxide film and the thermal treatment for increasing the film thickness of the first peripheral region of the first oxide film are carried out in the same process.

By the etching to form the trapezoidal portion, the end of the first oxide film and the end of the second oxide film may be damaged in some cases. According to the producing method of the present invention, the film qualities of the damaged first and second oxide films can be recovered by the thermal treatment. Film thicknesses of the first peripheral region of the first oxide film and the second peripheral region of the second oxide film are increased by the thermal treatment. If the ion implantation process is carried out, a probability in which the implanted ion collides against the ends of the first and second oxide films is high. Concerning this problem also, according to the producing method of the present invention, since the film thicknesses of the first peripheral region and second peripheral region are previously increased, it is possible to moderate the damage caused by the ion collision.

It is preferable that when a length from an end face to a central portion of the first oxide film in a film surface direction is defined as L, a range from the end face of the first oxide film to 2L/3 is allocated to the first peripheral region. The same can be said for the second peripheral region which belongs to the second oxide film. It is unnecessary to increase the film thickness of the central region which is not damaged from outside. By such film thickness is increased, there is an adverse possibility that characteristics of the first oxide film and second oxide film are changed.

A range in which a bird's beak enters the first oxide film and second oxide film from their end faces is specified, and the specified range may be allocated to the first peripheral region and second peripheral region.

According to the present invention, a relation between a film thickness of the first peripheral region and a film thickness of the first central region is adjusted as follows. The same can be said for a relation between a film thickness of the second peripheral region and a film thickness of the second central region.

If the average film thickness of the first oxide film in the first central region is defined as t1, the average film thickness of the first oxide film in the first peripheral region is adjusted to 1.5*t1. If the first oxide film in the first peripheral region has a shape whose thickness is gradually reduced from its end face to its central portion, the film thickness of the end face of the first oxide film may be defined as two times of the average film thickness of the first oxide film in the first central region.

The present invention is applied to a flash memory for example. In this case, a floating gate film and a control gate film are included in the plurality of films constituting the trapezoidal portion. The first oxide film corresponds to a gate oxide film sandwiched between a floating gate and semiconductor substrate. The second oxide film corresponds to a gate oxide film sandwiched between a floating gate and a control gate.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DESCRIPTION OF THE PREFERRED EMBODIMENT

A preferred embodiment of a semiconductor device and a producing method thereof according to the present invention will be explained below in detail with reference to the accompanying drawings. In the following explanation and the accompanying drawings, constituent elements having substantially the same function and structure are designated with the same symbols, and redundant explanation is omitted.

A producing method of a flash memory as a semiconductor device according to the embodiment of the present invention will be explained based on processes.

<Process 1>

Figure 1:
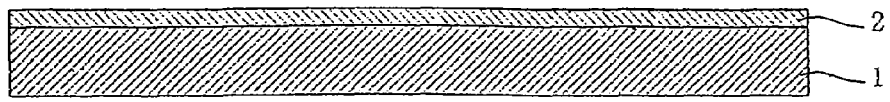
FIGS. 1A-1D are sectional views each showing different process in a producing method of a flash memory according to an embodiment of the present invention.
Figure 1:
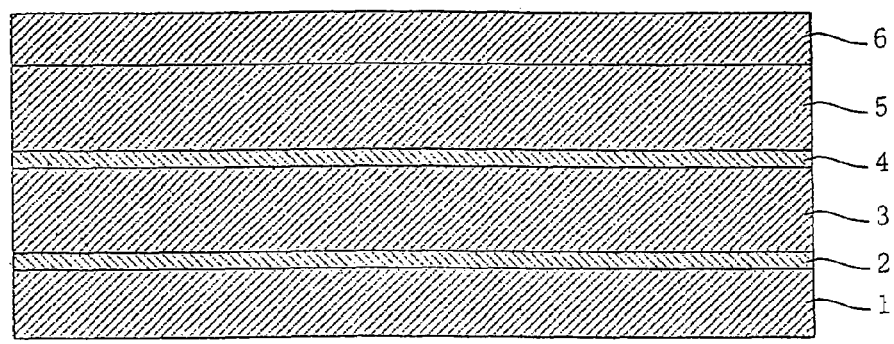
Figure 1:
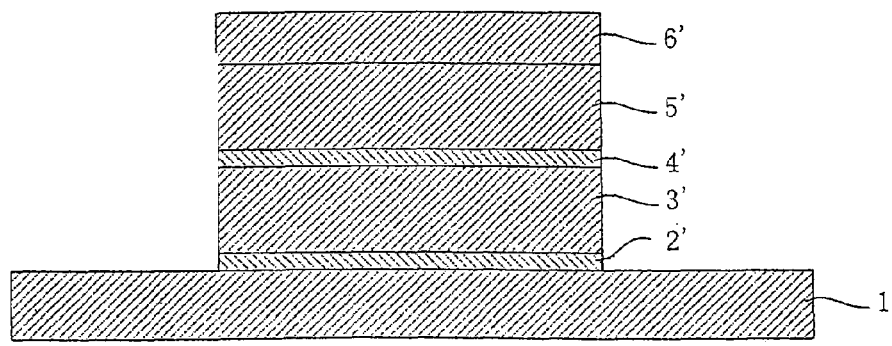
Figure 1:
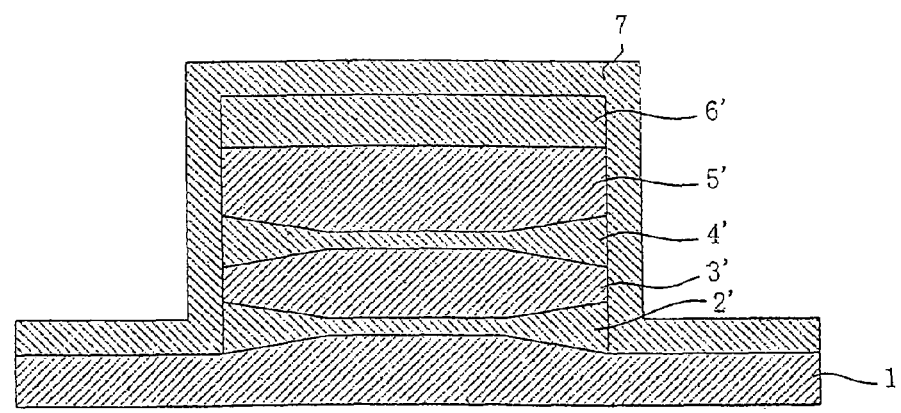

An active region (not shown) is formed on a silicon substrate 1, and a first oxide film 2 (film thickness is about 100 Å) which will become a gate oxide film of a flash memory cell is formed (FIG. 1A).

<Process 2>

A first polysilicon film (film thickness is about 1000 Å) 3 is formed by CVD method. A second oxide film 4 is formed on the first polysilicon film 3, and a second polysilicon film 5 is formed thereon.

Finally, the first polysilicon film 3 becomes a floating gate of a flash memory cell, and the second polysilicon film 5 becomes a control gate. The first oxide film 2 electrically insulates between the active region and the floating gate (first polysilicon film 3), and the second oxide film 4 electrically insulates between the floating gate (first polysilicon film 3) and the control gate (second polysilicon film 5).

<Process 3>

On the second polysilicon film 5, a tungsten silicide film 6 which functions as an electrode is formed (FIG. 1B).

<Process 4>

A photolithography process and an etching process are carried out to form a flash memory cell having desired characteristics (FIG. 1C). The previously formed first oxide film 2, first polysilicon film 3, second oxide film 4, second polysilicon film 5 and tungsten silicide film 6 are etched in this process, and respectively become first oxide film 2', first polysilicon film 3', second oxide film 4', second polysilicon film 5' and tungsten silicide film 6'. In general, RIE (Reactive Ion Etching) method is used. By this method, each film is etched with high anisotropy, and a sidewall of the flash memory cell becomes substantially vertical.

<Process 5>

A third oxide film 7 for covering the flash memory cell is formed using a thermal oxidation method (FIG. 1D). A thermal treatment temperature at that time is adjusted to 800 to 1000° C.

Thereafter, a flash memory is completed through some processes.

Figure 2:
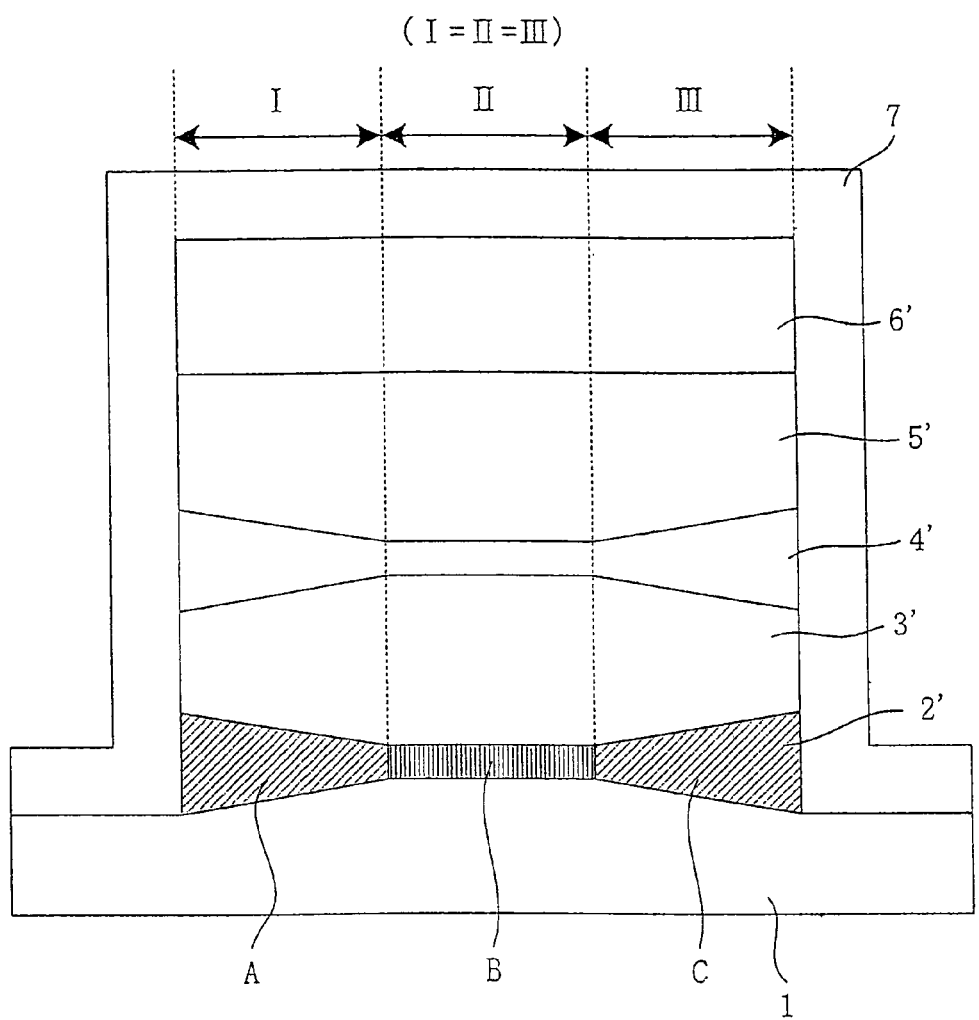
FIG. 2 is a sectional view of a flash memory cell when a thermal treatment is carried out under a first condition.

In the producing method of the embodiment, the process 5 has most distinguishing feature. That is, a thermal treating temperature, for example, is adjusted such that an end of the first oxide film 2' becomes thicker than a central portion thereof. FIG. 2 is an enlarged view of (FIG. 1D). By setting thermal treating time long, an oxidizer enters from the end of the first oxide film 2' to its central portion. As a result, a film thickness of the end of the first oxide film 2' becomes thicker than its central portion.

There is an adverse possibility that the etching process in process 4 may damage the end of the first oxide film 2'. More specifically, ion collides against the end of the first oxide film 2' in plasma atmosphere generating at the time of etching, and this deteriorates the film quality of the first oxide film 2'. If the first oxide film 2' whose film quality is deteriorated is left as it is, a predetermined performance (data retention characteristics, the number of data rewriting) can not be obtained in a memory cell array as a final product.

By carrying out the thermal treatment in process 5, the film quality of the first oxide film 2' which has been damaged in process 4 is recovered. That is, the thermal treatment in process 5 not only forms the third oxide film 7, but also exhibits a so-called treatment effect for the first oxide film 2'.

Next, conditions of the thermal treatment in process 5 will be explained. The thermal treatment explained here is carried out for the sake of not only forming the third oxide film 7, but also treating the first oxide film 2'. Since the damage caused by etching in process 4 mainly extends to the end of the first oxide film 2', the end is subjected to the treatment process. However, since the damage caused by etching is gradually weakened from the end to the central portion of the first oxide film 2' in process 5, the central portion need not be subjected to the same treatment as that of the end.

More specifically, it is preferable to carry out the thermal treatment in process 5 under one of the following first and second conditions.

[First Condition]

FIG. 2 is a sectional view of the flash memory cell when process 5 is carried out under the first condition. First, the first oxide film 2' is divided into three regions A, B and C. The regions A, B and C are set such that lengths I, II and III of the silicon substrate 1 in a plane direction becomes equal to each other. In FIG. 2, the flash memory cell is shown two-dimensionally, and the regions A, B and C are shown as being independent from each other, but in an actual case, the regions A and C are integral to constitute an annular region (peripheral region) surrounding the region B. The regions A, B and C are defined such that the length II (or its average value) of the first oxide film 2' in the plane direction of the central region (region B) and the lengths I and III of the annular regions (regions A and C) surrounding the central region in the plane direction, i.e., a width of the annular shape (or its average value) become equal to each other. If a length from an end face to the central portion of the first oxide film 2' in a film surface direction is defined as L, a range from the end face from the first oxide film 2' to 2L/3 becomes the regions A and C.

In process 5, the thermal treatment is carried out such that film thicknesses of the regions A and C among the regions A, B and C defined in the first oxide film 2' are increased. More specifically, the thermal treating time, the thermal treating temperature and other parameters are adjusted such that sectional areas of the regions A and C becomes 1.5 times of a sectional area of the region B. It is preferable that a film thickness of the region B is maintained in its state before process 5 is carried out. As a result, the average film thickness (value obtained by dividing integral of the film thickness of each region by a surface area of each region) of the regions A and C becomes 1.5 times of the average film thickness of the region B. The film thicknesses of the regions A and C are formed such that their end face areas in the vicinity of the first oxide film 2' are most thick, and the thicknesses are reduced toward the central portion. The film thicknesses of the end faces of the regions A and C are about two times of the average film thickness of the region B.

[Second Condition]

The first oxide film 2' is formed from the first oxide film 2 by the etching in process 4, and at that time, the end face of the first oxide film 2' is exposed. Conventionally, if the thermal treatment is carried out from this state, the oxidizer enters from the end face of the first oxide film 2', a region whose shape is similar to a beak of a bird is adversely formed on an end of the first oxide film 2'. This portion is called "bird's beak".

Figure 3:
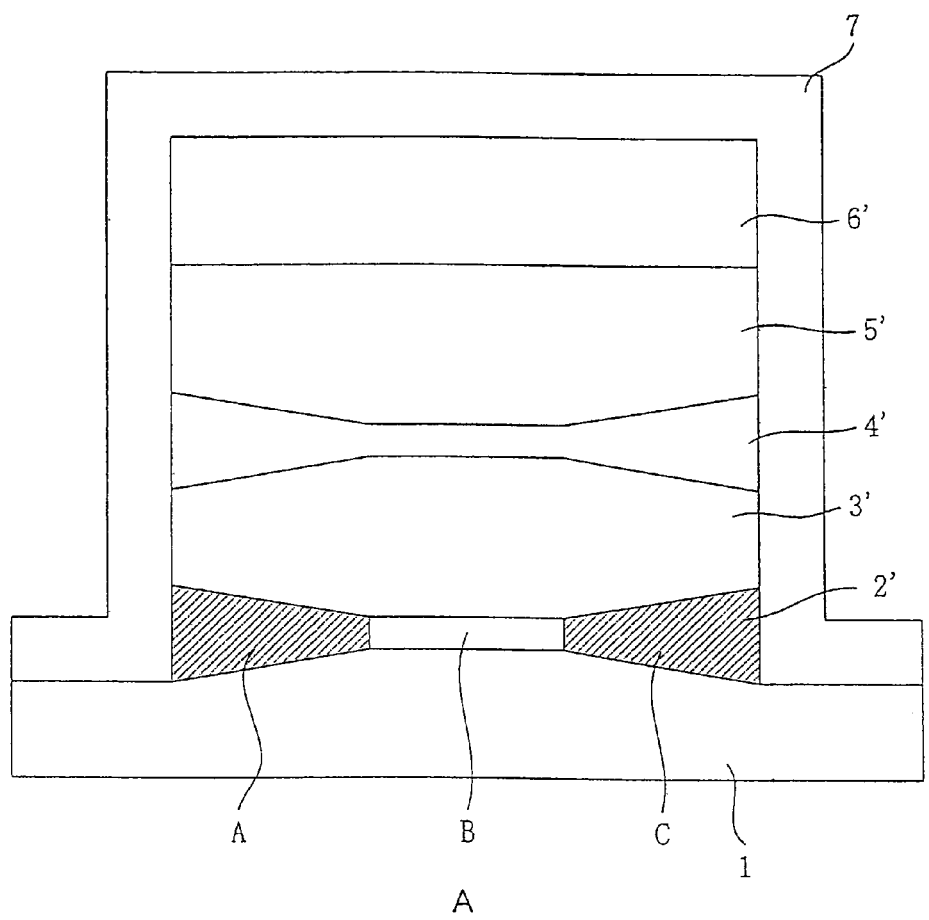
FIGS. 3A and 3B are sectional views of the flash memory cell when the thermal treatment is carried out under a second condition.
Figure 3:
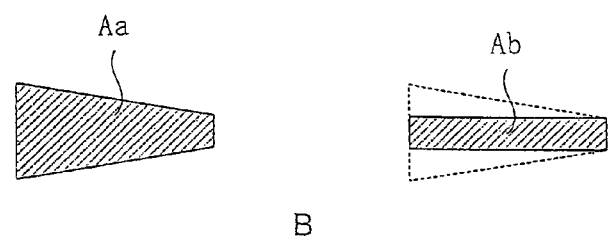

FIG. 3A is a sectional view of the flash memory cell when process 5 is carried out under the second condition. In the drawing, the regions A and C where the bird's beak enters the end of the first oxide film 2' are shown with oblique lines. In FIG. 3A, the flash memory cell is shown two-dimensionally, and the regions A, B and C are shown as being independent from each other, but in an actual case, the regions A and C are integral to constitute an annular region (peripheral region) surrounding the region B where no bird's beak enters.

The entering amount of the bird's beak in the first oxide film 2' is varied depending upon the film thickness of the first oxide film 2' and a thermal treatment condition. In this regard, if a correlation thereof is researched by an experiment or simulation, it is possible to precisely grasp the entering amount of the bird's beak which may be generated in the first oxide film 2' in the producing method of a flash memory serving as a product.

In process 5, the thermal treatment is carried out such that the film thicknesses of the regions A and C into which the bird's beak enters in the first oxide film 2' are as shown in FIG. 3B. More specifically, as shown in FIG. 3B, if the region A before the thermal treatment of process 5 is carried out is defined as a region Ab, and the region A after the thermal treatment is defined as a region Aa, the thermal treating time, thermal treating temperature and other parameters are adjusted such that a sectional area of the region Aa becomes 1.5 times of a sectional area of the region Ab. The same can be said for the region C. It is preferable that the film thickness of the region B where no bird's beak enters is maintained in its state before process 5 is carried out.

By carrying out process 5 under one of the first and second conditions, the film quality of the first oxide film 2' damaged by the etching in process 4 is recovered. The treatment processing for the first oxide film 2' is carried out only for improving the film quality of the first oxide film 2'. The film thickness of the first oxide film 2' is increased by the treatment processing, but according to the producing method of the embodiment, a degree of the treatment processing is controlled based on the increasing amount of the film thickness and its range. Therefore, it is possible to improve the film quality of the first oxide film 2' more precisely. Further, the influence of the treatment processing of the end of the first oxide film 2' which is not damaged by the etching does not extend to its central portion and thus, it is possible to prevent the film quality of the central portion from being changed.

Although the film thickness of the end of the first oxide film 2' is increased in process 5, since the first oxide film 2' has this shape, the following effect is obtained.

In order to produce the flash memory cell, some processes are required even after process 5, and in the processes, an ion implantation process for forming an impurity diffusing region in the silicon substrate 1 is included. There is an adverse possibility that the end of the first oxide film 2' is damaged by ion implanted at that time. In this regard, according to the producing method of the embodiment, since the film thickness of the end of the first oxide film 2' is previously increased in process 5, the damage by ion impact is moderated, and the film quality is prevented from being deteriorated.

In the above description, the producing method for improving the film quality of the first oxide film 2' damaged by the etching in process 4 has been explained based on the first oxide film 2'. However, the etching in process 4 exerts an influence not only upon the first oxide film 2' but also upon the second oxide film 4' in some cases.

A cause of damage of the second oxide film 4' is the same as that of the first oxide film 2'. That is, ion collides against an end of the second oxide film 4' in plasma atmosphere generated at the time of etching, and this deteriorates the film quality of the second oxide film 4'. If the second oxide film 4' whose film quality is deteriorated is left as it is, a predetermined performance (data retention characteristics, the number of data rewriting) can not be obtained in a memory cell array as a final product.

By carrying out the thermal treatment in process 5, the film quality of the second oxide film 4' which has been damaged together with the first oxide film 2' in process 4 is recovered. That is, the thermal treatment in process 5 not only forms the third oxide film 7, but also exhibits a so-called treatment effect for the first oxide film 2' and the second oxide film 4'.

Next, conditions of the thermal treatment in process 5 will be explained. The thermal treatment explained here is carried out for the sake of not only forming the third oxide film 7, but also treating the first oxide film 2' and the second oxide film 4'. Since the damage caused by etching in process 4 mainly extends to the ends of the first oxide film 2' and the second oxide film 4', the ends are subjected to the treatment process. However, since the damage caused by etching is gradually weakened from each of the ends to the central portions of the first oxide film 2' and the second oxide film 4', the central portions need not be subjected to the same treatment as that of the ends in process 5.

More specifically, it is preferable that a thermal treatment in process 5 is carried out under one of the following third and fourth conditions.

[Third Condition]

Figure 4:
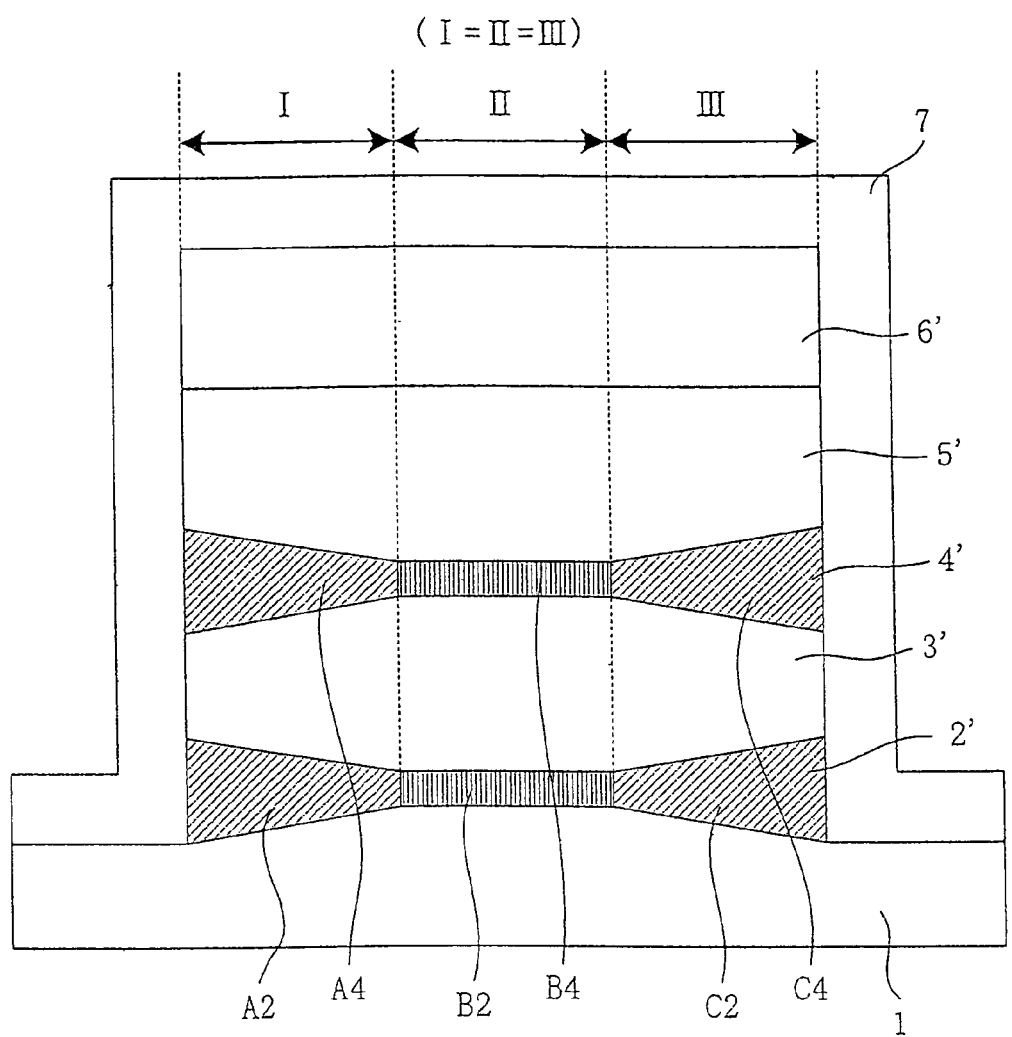
FIG. 4 is a sectional view of the flash memory cell when the thermal treatment is carried out under a third condition.

FIG. 4 is a sectional view of the flash memory cell when process 5 is carried out under the third condition. First, the first oxide film 2' is divided into three regions A2, B2 and C2. The regions A2, B2 and C2 are set such that lengths I, II and III of the silicon substrate 1 in a plane direction becomes equal to each other. Similarly, the second oxide film 4' is divided into three regions A4, B4 and C4. The regions A4, B4 and C4 are set such that lengths I, II and III of the silicon substrate 1 in a plane direction becomes equal to each other. In FIG. 4, the flash memory cell is shown two-dimensionally, and the regions A2, B2 and C2 and the regions A4, B4 and C4 are shown as being independent from each other, but in an actual case, the regions A2 and C2 are integral to constitute an annular region (peripheral region) surrounding the region B2, and the regions A4 and C4 are integral to constitute an annular region (peripheral region) surrounding the region B4. The regions A2, B2 and C2 and the regions A4, B4 and C4 are defined such that the lengths II (or their average values) of the first oxide film 2' and the second oxide film 4' in the plane direction of the central regions (regions B2 and B4) and the lengths I and III of the annular regions (regions A2, C2, A4, C4) surrounding the central regions in the plane direction, i.e., width of the annular shapes (or their average values) become equal to each other.

In process 5, the thermal treatment is carried out such that film thicknesses of the regions A2 and C2 defined in the first oxide film 2' and film thicknesses of the regions A4 and C4 defined in the second oxide film 4' are increased. More specifically, the thermal treating time, the thermal treating temperature and other parameters are adjusted such that sectional areas of the regions A2 and C2 becomes 1.5 times of a sectional area of the region B2, and sectional areas of the regions A4 and C4 becomes 1.5 times of a sectional area of the region B4. It is preferable that film thicknesses of the regions B2 and B4 are maintained in their states before process 5 is carried out.

[Fourth Condition]

The second oxide film 4' is formed from the second oxide film 4 by the etching in process 4, and at that time, the end face of the second oxide film 4' is exposed. Conventionally, if the thermal treatment is carried out from this state, the oxidizer enters from the end face of the second oxide film 4', and the bird's beak is generated on the end of the second oxide film 4' like the first oxide film 2'.

Figure 5:
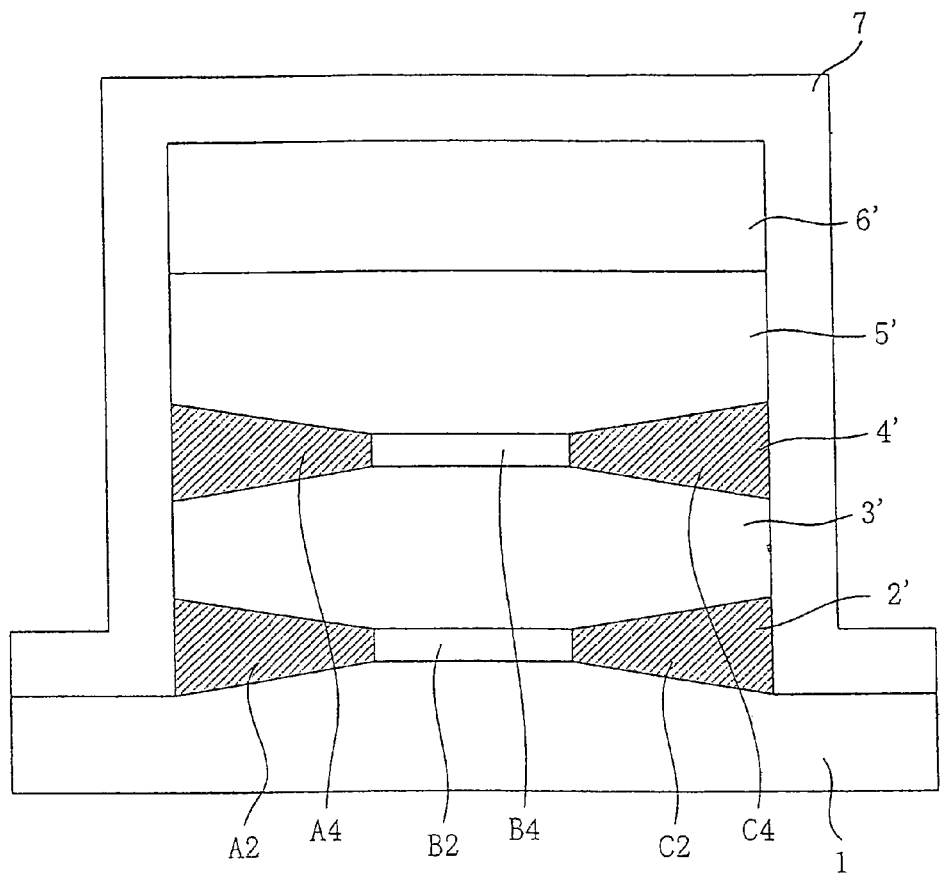
FIGS. 5A and 5B are sectional views of the flash memory cell when the thermal treatment is carried out under a fourth condition.
Figure 5:
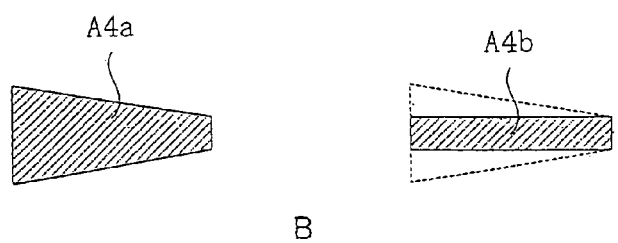

FIG. 5A is a sectional view of the flash memory cell when process 5 is carried out under the fourth condition. In the drawing, the regions A2 and C2 where the bird's beak enters the end of the first oxide film 2', and the regions A4 and C4 where the bird's beak enters the end of the second oxide film 4' are shown with oblique lines. In FIG. 5A, the flash memory cell is shown two-dimensionally, and the regions A2, B2 and C2 and the regions A4, B4 and C4 are shown as being independent from each other, but in an actual case, the regions A2 and C2 are integral to constitute an annular region (peripheral region) surrounding the region B2, and the regions A4 and C4 are integral to constitute an annular region (peripheral region) surrounding the region B4.

In process 5, the thermal treatment is carried out such that the film thicknesses of the regions A2 and C2 into which the bird's beak enters in the first oxide film 2', and the film thicknesses of the regions A4 and C4 into which the bird's beak enters in the second oxide film 4' are as shown in FIG. 5B. More specifically, as shown in FIG. 5B, if the region A4 before the thermal treatment of process 5 is carried out is defined as a region A4b, and the region A4 after the thermal treatment is defined as a region A4a, the thermal treating time, thermal treating temperature and other parameters are adjusted such that a sectional area of the region A4a becomes 1.5 times of a sectional area of the region A4b. The same can be said for the region C4. Further, if the region A2 before the thermal treatment of process 5 is carried out is defined as a region A2b, and the region A2 after the thermal treatment is defined as a region A2a, the thermal treating time, thermal treating temperature and other parameters are adjusted such that a sectional area of the region A2a becomes 1.5 times of a sectional area of the region A2b. The same can be said for the region C2. It is preferable that the film thicknesses of the regions C4 and C2 where no bird's beak enters is maintained in its state before process 5 is carried out.

By carrying out process 5 under one of the second and fourth conditions, the film quality of each of the first oxide film 2' and second oxide film 4' damaged by the etching in process 4 is recovered. The treatment processing for each of the first oxide film 2' and second oxide film 4' is carried out only for improving the film quality of the first oxide film 2' and second oxide film 4'. The film thickness of each of the first oxide film 2' and second oxide film 4' is increased by the treatment processing, but according to the producing method of the embodiment, a degree of the treatment processing is controlled based on the increasing amount of the film thickness and its range. Therefore, it is possible to improve the film quality of each of the first oxide film 2' and second oxide film 4' more precisely. Further, the influence of the treatment processing of the end of each of the first oxide film 2' which is not damaged by the etching and second oxide film 4' does not extend to its central portion and thus, it is possible to prevent the film quality of the central portion from being changed.

Although the film thickness of the end of each of the first oxide film 2' and second oxide film 4' is increased in process 5, since the first oxide film 2' and second oxide film 4' has this shape, the following effect is obtained.

In order to produce the flash memory cell, some processes are required even after process 5, and in the processes, an ion implantation process for forming an impurity diffusing region in the silicon substrate 1 is included. There is an adverse possibility that the end of each of the first oxide film 2' and second oxide film 4' is damaged by ion implanted at that time. In this regard, according to the producing method of the embodiment, since the film thickness of the end of the first oxide film 2' and second oxide film 4' is previously increased in process 5, the damage by ion impact is moderated, and the film quality is prevented from being deteriorated.

As described above, according to the producing method of the flash memory of the embodiment, film qualities of the first oxide film 2' and the second oxide film 4' are maintained at excellent level. As a result, it is possible to obtain a flash memory having excellent characteristics such as the data retention time and the number of data rewriting.

Although the preferred embodiment of the present invention has been explained with reference to the drawings, the invention is not limited to the embodiment. It should be understood that a person skilled in the art will reach various modifications and modified examples within a range of technical idea described in patent claims, and such modifications and modified examples belong to the technical range of the invention.

What is claimed is:

1. A producing method of a semiconductor device comprising:
    forming a trapezoidal portion including a first oxide film which functions as a gate oxide film and a plurality of other films,
    wherein said first oxide film has a first peripheral region including an end face of said first oxide film, and a first central region surrounded by said first peripheral region; and
    adjusting a thermal treatment of said trapezoidal portion so that a film thickness of said first oxide film in said first peripheral region is thicker than a film thickness of said first oxide film in said first central region,
    wherein a length from the end face to a midpoint of the first central region of said first oxide film of said trapezoidal portion is L, and a length of said first peripheral region from the end face of said first oxide film is 2L/3.

2. A producing method of a semiconductor device according to claim 1, wherein after the thermal treatment, said first oxide film has a bird's beak shape from said end face of said first oxide film.

3. A producing method of a semiconductor device according to claim 1, wherein an average film thickness of said first oxide film in said first central region is t1, and an average film thickness of said first oxide film in said first peripheral region is 1.5*t1 subsequent the thermal treatment.

4. A producing method of a semiconductor device according to claim 1, wherein after the thermal treatment, a film thickness of said end face of said first oxide film is two times an average film thickness of said first oxide film in said first central region.

5. A producing method of a semiconductor device according to claim 1, wherein said forming a trapezoidal portion includes forming a floating gate film as one of said plurality of other films, and wherein said first oxide film is located below said floating gate film.

6. A producing method of a semiconductor device according to claim 1, wherein said forming a trapezoidal portion includes forming a second oxide film as one of said plurality of other films,
    wherein said second oxide film has a second peripheral region including an end face of said second oxide film, and a second central region surrounded by said second peripheral region, and
    wherein after the thermal treatment, a film thickness of said second oxide film in said second peripheral region is thicker than a film thickness of said second oxide film in said second central region.

7. A producing method of a semiconductor device according to claim 6, wherein a length from the end face of said second oxide film to a midpoint of the second central region of said second oxide film of said trapezoidal portion is L, and a length of said second peripheral region from the end face of said second oxide film is 2L/3.

8. A producing method of a semiconductor device according to claim 6, wherein after the thermal treatment, said second oxide film has a bird's beak shape from said end face of said second oxide film.

9. A producing method of a semiconductor device according to claim 6, wherein an average film thickness of said second oxide film in said second central region is t2, and an average film thickness of said second oxide film in said second peripheral region is 1.5*t2 subsequent the thermal treatment.

10. A producing method of a semiconductor device according to claim 6, wherein after the thermal treatment, a film thickness of said end face of said second oxide film is two times an average film thickness of said second oxide film in said second central region.

11. A producing method of a semiconductor device according to claim 6, wherein said forming a trapezoidal portion includes forming a floating gate film as one of said plurality of other films, and
    wherein said first oxide film is located below said floating gate film, and said second oxide film is located above said floating gate film.

* * * * *